(12) United States Patent
He et al.

(10) Patent No.: US 12,314,097 B2
(45) Date of Patent: May 27, 2025

(54) VALIDATION METHOD, DEMO BOARD, VALIDATION SYSTEM, AND NON-TRANSITORY STORAGE MEDIUM

(71) Applicant: Fulian Precision Electronics (Tianjin) Co., LTD., Tianjin (CN)

(72) Inventors: Li-Quan He, Tianjin (CN); Duo Qiu, Tianjin (CN); Wei-Chen Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 441 days.

(21) Appl. No.: 18/072,555

(22) Filed: Nov. 30, 2022

(65) Prior Publication Data
US 2023/0354549 A1    Nov. 2, 2023

(30) Foreign Application Priority Data

Apr. 28, 2022   (CN) .......................... 202210493901.3

(51) Int. Cl.
  *G06F 1/20*    (2006.01)
  *H05K 7/20*    (2006.01)
(52) U.S. Cl.
  CPC ......... *G06F 1/206* (2013.01); *H05K 7/20136* (2013.01); *H05K 7/20236* (2013.01)

(58) Field of Classification Search
  CPC ........ G06F 1/206; G06F 1/20; G06F 11/2221; H05K 7/20136; H05K 7/20236; H05K 7/20763; H05K 7/20745; H05K 7/20836
  See application file for complete search history.

(56) References Cited

U.S. PATENT DOCUMENTS

| | | | |
|---|---|---|---|
| 7,724,524 B1 * | 5/2010 | Campbell | H05K 7/20772 165/104.19 |
| 11,452,241 B2 * | 9/2022 | Tufty | H05K 7/1492 |
| 2016/0102880 A1 * | 4/2016 | Lovicott | F24F 11/83 700/300 |
| 2018/0317346 A1 * | 11/2018 | Best | H05K 7/20381 |
| 2020/0093032 A1 * | 3/2020 | Enright | H05K 7/20818 |
| 2021/0410319 A1 * | 12/2021 | Manousakis | H05K 7/20809 |
| 2022/0264768 A1 * | 8/2022 | Horng | H05K 7/20327 |
| 2023/0217625 A1 * | 7/2023 | Gao | H05K 7/20781 |

* cited by examiner

*Primary Examiner* — Chun Cao
(74) *Attorney, Agent, or Firm* — ScienBiziP, P.C.

(57) ABSTRACT

A validation method relating to the validation of immersion-cooled servers in an air cooling environment obtains a requirement or purchase order, the order including types of immersion-cooled servers and number required. The method builds a validation environment accordingly, the validation environment includes first fans and air cooling power modules. The air cooling power modules includes a number of power supply units and a number of second fans. The method executes one or more tests in an assembled validation environment. The method further generates a result of test. A demo board and a non-transitory storage medium are also disclosed.

20 Claims, 7 Drawing Sheets

VALIDATION METHOD, DEMO BOARD, VALIDATION SYSTEM, AND NON-TRANSITORY STORAGE MEDIUM

FIELD

The subject matter herein generally relates to validation technology, and particularly to a validation method, a demo board, a validation system, and a non-transitory storage medium.

BACKGROUND

As data centers develop, a power density per cabinet in the data center is becoming greater. An air cooling system by itself cannot satisfy cooling demands of the data center, and its place is taken by the liquid cooling system. Immersion liquid cooling system is a liquid cooling system. Immersion-cooled servers are directly submerged in a cooling liquid and are sealed in the tank. Heat from the immersion-cooled server is removed by a loop of circulating cooling liquid. The immersion liquid cooling is a typical direct contact liquid cooling, which has a higher cooling effect, and has a low noise level compared with the air cooling and the other liquid cooling, for example a cold plate and a spray liquid cooling, and so on.

Figure 1:
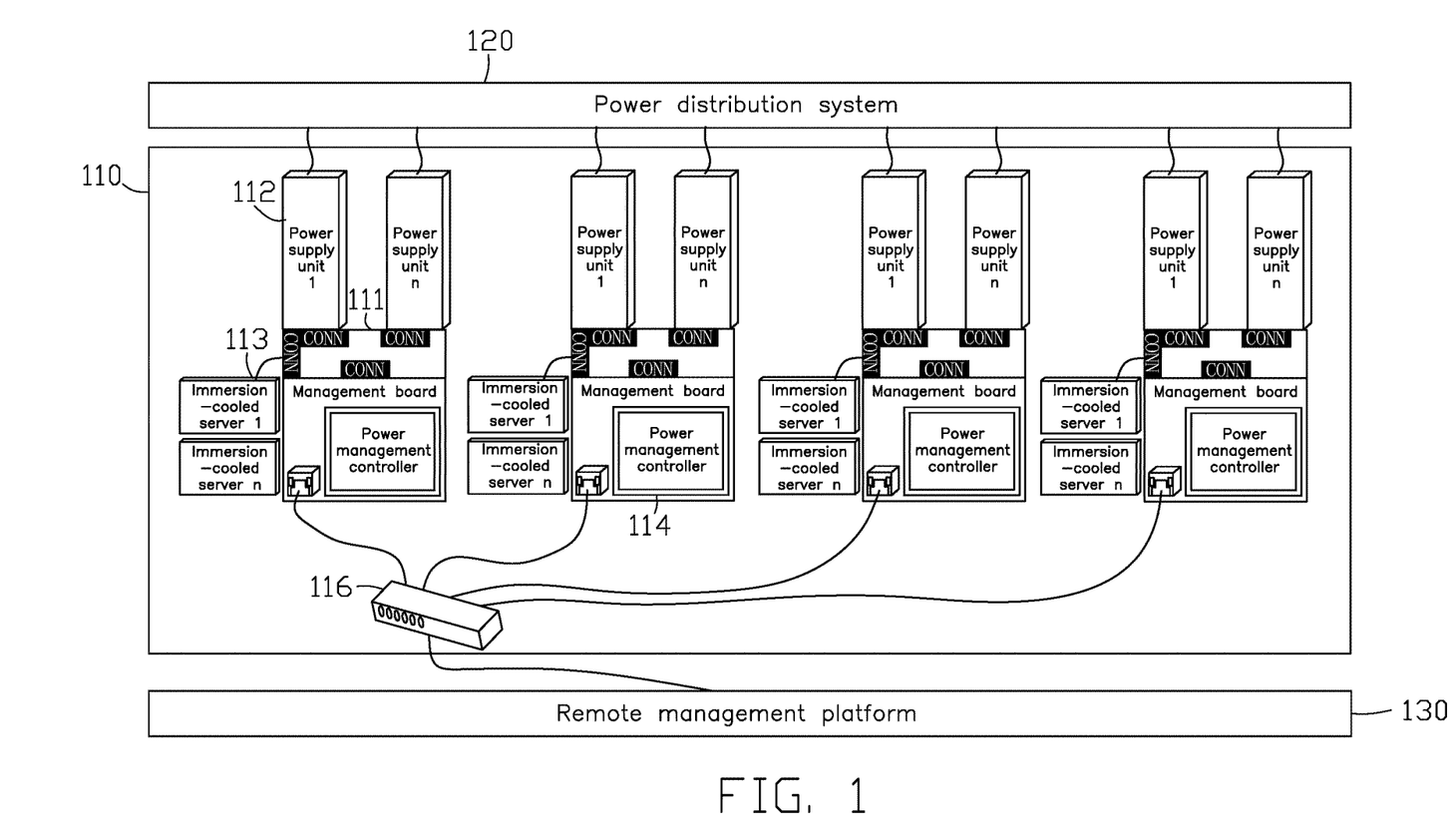
FIG. 1 is a schematic view of an application scenario of a tank in prior art.
Figure 2:
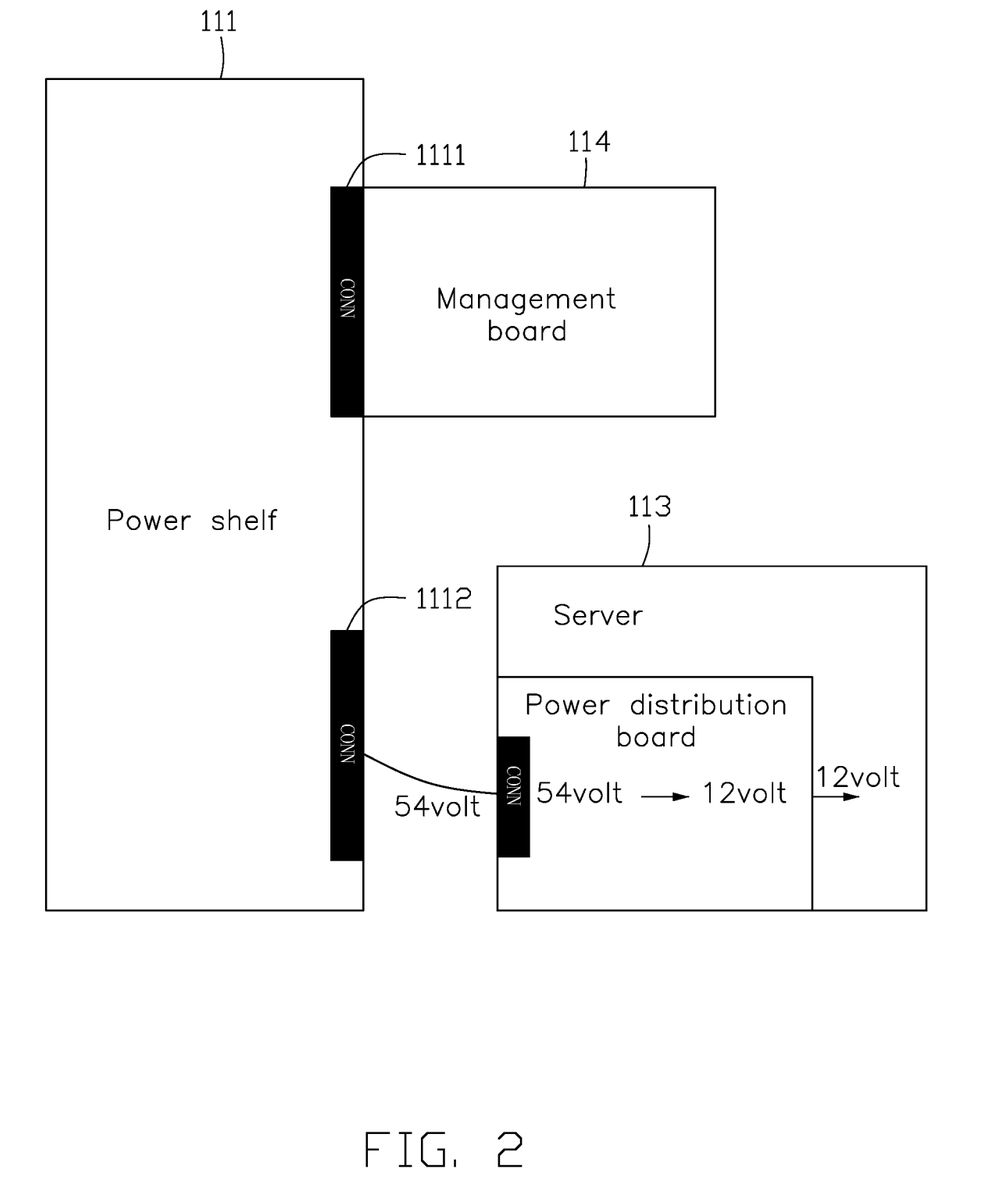
FIG. 2 is a schematic view of a validation system in prior art.

The immersion liquid cooling system is centrally powered by a power system. As shown in FIG. 1, the tank 110 of the immersion liquid cooling system can include a number of power shelves 111. Each power shelf 111 can support a number of power supply units 112. Each power supply unit 112 can convert alternating current voltage of the mains provided by an external power distribution system 120 to a 54 volt low-voltage direct current voltage, and provide the 54 volt supply to the immersion-cooled servers 113 in the tank 110. Each power shelf 111 can correspond to a management board 114. The management board 114 can be configured to monitor an operation of the power supply unit 112, and transmit operations of the monitored power supply units 112 to a remote management platform 130 external to the tank via exchangers 116. Thus, an out of band management can be achieved. Components, such as the immersion-cooled servers, in the tank can be shipped independently from the tank, and are validated before shipment. For example, as shown in FIG. 2, the power shelf 111 can include a first interface 1111 and a second interface 1112. The first interface 1111 is coupled to the immersion-cooled server 113. The second interface 1112 is coupled to the management board 114. The validation method can directly validate the immersion-cooled server 113 via the power shelves 111, or further validate the management board 114. However, the tanks corresponding to different immersion-cooled servers can themselves be different, and prices of the tanks are expensive.

SUMMARY

An embodiment of the present application provides a validation method, a demo board, a validation system, and a non-transitory storage medium, which lows the validation cost.

In a first aspect, an embodiment of the present application provides a validation method. The method is configured to validate immersion-cooled servers in an air cooling environment. A supply voltage required for the immersion-cooled servers is the first voltage. The method is applied on a demo board. The method obtains a requirement order. The requirement order includes types of the immersion-cooled servers and a required number of the immersion-cooled servers. The method builds a validation environment according to the types of the immersion-cooled servers and the required number of the immersion-cooled servers. The validation environment includes a first number of first fans and a second number of air cooling power modules. A supply voltage required for each first fan is the first voltage. The first fans are configured to dissipate heat from the immersion-cooled servers when the immersion-cooled servers are operating. The air cooling power modules includes a number of power supply units and a number of second fans. The power supply units are configured to provide electric power to the immersion-cooled servers and the first fans. The second fans are configured to dissipate heat from the power supply units when the power supply units are operating. The method executes one or more tests in an assembled validation environment. The assembled validation environment includes a number of first interfaces of the demo board coupled to the immersion-cooled servers, a number of second interfaces of the demo board coupled to the first fans, and a number of third interfaces of the demo board coupled to the air cooling power modules. The one or more tests include a test for testing a power consumption and a heat dissipation test of the immersion-cooled servers. The method further generates a result of test.

According to some embodiments of the present application, the method further determines whether the result of the test meets a preset condition. The method builds an updated validation environment according to the result of the test and the preset condition, and repeats executing one or more tests in the updated validation environment and generating a result of the test if the result of the test does not meet the preset condition, until the result of the test meets the preset condition; wherein a number of the first fans and/or a number of the air cooling power modules in the updated validation environment are varied.

According to some embodiments of the present application, building the validation environment according to the types of the immersion-cooled servers and the required number of the immersion-cooled servers includes determining a power consumption of all of the immersion-cooled servers when all of the immersion-cooled servers are operating at full load according to the types of the immersion-cooled servers and the required number of the immersion-cooled servers; determining the first fans being required, the first number of the first fans, the air cooling power modules being required, and the second number of the air cooling power modules according to the power consumption of all of the immersion-cooled servers and a result of a thermal simulation on all of the immersion-cooled servers; and building the validation environment according to the determined first fans, the determined first number of the first fans, the determined air cooling power modules, and the determined second number of the air cooling power modules.

According to some embodiments of the present application, determining the first fans being required, the first number of the first fans, the air cooling power modules being required, and the second number of the air cooling power modules according to the power consumption of all of the immersion-cooled servers and the result of the thermal simulation on all of the immersion-cooled servers includes, performing the thermal simulation on all of the immersion-cooled servers to determine the first fans being required and the first number of the first fans; determining a power consumption of all of the first fans according to the determined first fans and the determined first number of the first fans; and determining the air cooling power modules being required and the second number of the air cooling power modules according to the power consumption of all of the immersion-cooled servers and the power consumption of all of the first fans.

According to some embodiments of the present application, in the assembled validation environment, a 54 volt direct current (DC) voltage is provided to the immersion-cooled servers and the first fans via the air cooling power modules.

According to some embodiments of the present application, in the assembled validation environment, a number of fourth interfaces of the demo board are coupled to management boards. The one or more tests further include an Ethernet communication test of the management boards.

According to some embodiments of the present application, the number of fourth interfaces is at least three. The management boards include one or more master management boards and two or more slave management boards. Each master management board is configured to manage two or more slave management boards. The one or more tests further include a communication test between each master management board and the corresponding slave management boards.

In a second aspect, an embodiment of the present application provides a demo board. The demo board includes at least one processor and a storage device. The storage device stores one or more programs, the one or more programs being executed by the at least one processor. The at least one processor obtains a requirement order. The requirement order includes types of the immersion-cooled servers and a required number of the immersion-cooled servers. A supply voltage required for the immersion-cooled servers is a first voltage. The at least one processor builds a validation environment according to the types of the immersion-cooled servers and the required number of the immersion-cooled servers. The validation environment includes a first number of first fans and a second number of air cooling power modules. A supply voltage required for each first fan is the first voltage. The first fans are configured to dissipate heat from the immersion-cooled servers when the immersion-cooled servers are operating. The air cooling power modules includes a number of power supply units and a number of second fans. The power supply units are configured to provide electric power to the immersion-cooled servers and the first fans. The second fans are configured to dissipate heat from the power supply units when the power supply units are operating. The at least one processor executes one or more tests in an assembled validation environment. The assembled validation environment includes a number of first interfaces of the demo board coupled to the immersion-cooled servers, a number of second interfaces of the demo board coupled to the first fans, and a number of third interfaces of the demo board coupled to the air cooling power modules. The one or more tests include a test for testing a power consumption and a heat dissipation of the immersion-cooled servers. The at least one processor generates a result of test.

In a third aspect, an embodiment of the present application provides a validation system. The validation system includes a demo board. The demo board includes at least one processor and a storage device. The storage device stores one or more programs, the one or more programs being executed by the at least one processor. The at least one processor obtains a requirement order. The requirement order includes types of the immersion-cooled servers and a required number of the immersion-cooled servers. A supply voltage required for each immersion-cooled server is a first voltage. The at least one processor builds a validation environment according to the types of the immersion-cooled servers and the required number of the immersion-cooled servers. The validation environment includes a first number of first fans and a second number of air cooling power modules. A supply voltage required for each first fan is the first voltage. The first fans are configured to dissipate heat from the immersion-cooled servers when the immersion-cooled servers are operating. The air cooling power modules includes a number of power supply units and a number of second fans. The power supply units are configured to provide electric power to the immersion-cooled servers and the first fans. The second fans are configured to dissipate heat from the power supply units when the power supply units are operating. The at least one processor executes one or more tests in an assembled validation environment. The assembled validation environment includes a number of first interfaces of the demo board coupled to the immersion-cooled servers, a number of second interfaces of the demo board coupled to the first fans, and a number of third interfaces of the demo board coupled to the air cooling power modules. The one or more tests include a test for testing a power consumption and a heat dissipation of the immersion-cooled servers. The at least one processor generates a result of test.

In a fourth aspect, an embodiment of the present application also provides a non-transitory storage unit. The non-transitory storage device stores one or more programs, the one or more programs being executed by the at least one processor. The at least one processor obtains a requirement order. The requirement order includes types of the immersion-cooled servers and a required numbers of the immersion-cooled servers. A supply voltage required for each immersion-cooled server is a first voltage. The at least one processor builds a validation environment according to the types of the immersion-cooled servers and the required number of the immersion-cooled servers. The validation environment includes a first number of first fans and a second number of air cooling power modules. A supply voltage required for each first fan is the first voltage. The first fans are configured to dissipate heat from the immersion-cooled servers when the immersion-cooled servers are operating. The air cooling power modules includes a number of power supply units and a number of second fans. The power supply units are configured to provide electric power to the immersion-cooled servers and the first fans. The second fans are configured to dissipate heat from the power supply units when the power supply units are operating. The at least one processor executes one or more tests in an assembled validation environment. The assembled validation environment includes a number of first interfaces of the demo board coupled to the immersion-cooled servers, a number of second interfaces of the demo board coupled to the first fans, and a number of third interfaces of the demo board coupled to the air cooling power modules. The one or more tests include a test for testing a power consumption and a heat dissipation of the immersion-cooled servers. The at least one processor generates a result of test.

Under this disclosure, the requirement order is obtained, the validation environment is built, to include the first number of the first fans and the second number of the air cooling power modules, the one or more tests are executed in the assembled validation environment, and the result of the test is generated. The first fans are configured to dissipate heat from the immersion-cooled servers when the immersion-cooled servers are operating. Each air cooling power module includes a power supply unit and a second fan. The power supply units are configured to provide power for the immersion-cooled servers and the first fans. The second fans are configured to dissipate heat from the power supply units when the power supply units are operating. Thus, the disclosure allows validation of the immersion-cooled servers in the air cooling environment which can lower the validation cost, and the disclosure builds the validation environment according to the requirement order, thus the validation requirement of immersion-cooled servers with different configurations can be met, and the number of air cooling power modules and the first fans can be flexibly increased or decreased according to the immersion-cooled servers with different configurations, thus a quick validation of the immersion-cooled servers can be achieved.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Implementations of the disclosure will now be described, by way of embodiments only, with reference to the drawings. The disclosure is illustrative only, and changes may be made in the detail within the principles of the present disclosure. It will therefore be appreciated that the embodiments may be modified within the scope of the claims.

In addition, it should be understood that in the description of this application, terms such as "first" and "second" are used only for distinguishing in the description, but are not intended to indicate or imply relative importance or an order. The terms "exemplary" and/or "example" are used herein to mean "serving as an example, instance, or illustration." Any embodiment described herein as "exemplary" and/or "example" is not necessarily to be construed as preferred or advantageous over other embodiments. A feature limited by "first", "second" may expressly or implicitly include one or more of the features. Use of the word "exemplary" is intended to present concepts and techniques in a concrete fashion. As used herein, the term "and/or," includes any and all combinations of one or more of the associated listed items.

It should be noted that the steps shown in the flowcharts can be performed by computer executable instructions in a computer system. In addition, although a logical sequence is shown in the flowcharts, in some circumstance, the shown or described steps may be performed in a sequence which is different from the sequence described herein.

Figure 3A:
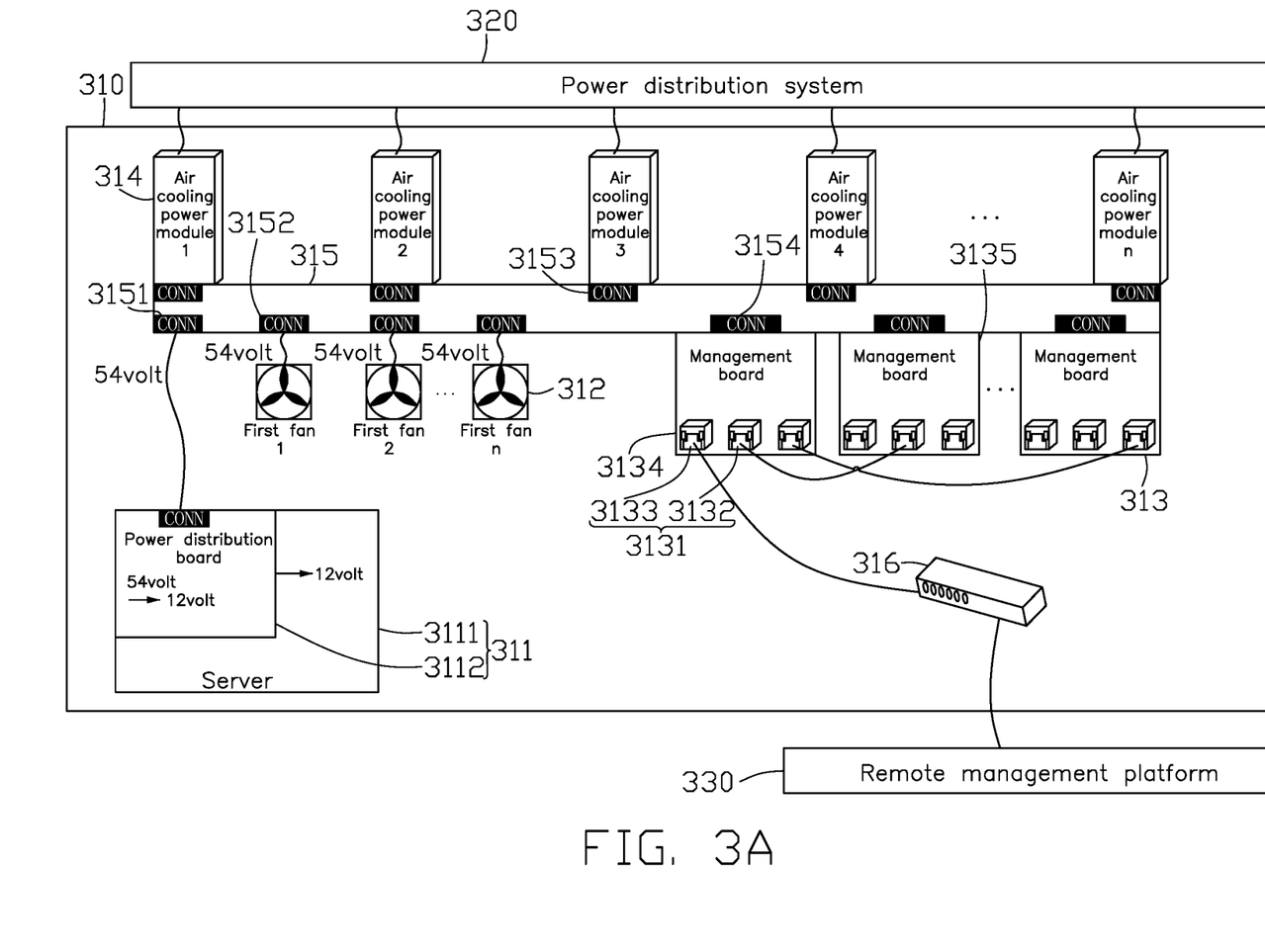
FIG. 3A is a schematic view of an embodiment of an application scenario of a validation system according to an embodiment of the present disclosure.

Referring to FIG. 3A, FIG. 3A is a schematic view of an embodiment of an application scenario of a validation system. The validation system 310 can validate a number of immersion-cooled servers 311 in an air cooling environment. In some embodiments, the validation system 310 can further validate a number of management boards 313 in the air cooling environment. The validation system 310 can communicate with a power distribution system 320 and a remote management platform 330. The validation system 310 can include the immersion-cooled servers 311, a number of first fans 312, a number of management boards 313, a number of air cooling power modules 314, a demo board 315, and an exchanger 316. A person skilled in the art may understand that the structure shown in FIG. 3A does not constitute any limitation on the validation system 310. The validation system 310 may include components more or fewer than those shown in the figure, or some components in the validation system 310 may be combined, some components split, or the components are differently disposed.

Each immersion-cooled server 311 can include a server 3111. In some embodiments, each immersion-cooled server 311 can further include a power distribution board 3112. The power distribution board 3112 can be configured to convert a first voltage to a second voltage, for example convert a 54 volt DC voltage to a 12 volt DC voltage. The power distribution board 3112 is further configured to provide the second voltage to the server 3111, for example provide the 12 volt DC voltage to the server 3111.

Each first fan 312 can be a 54 volt fan. The supply voltage required for each fan is 54 volt. The first fans 312 can accept the 54 volt DC voltage. The first fans 312 are configured to dissipate heat from the immersion-cooled servers 311 when the immersion-cooled servers 311 are operating. In some embodiments, respective speeds of the first fans 312 can be adjusted via pulse width modulations (PWM) applied to the first fans 312.

In some embodiments, the management boards 313 can be power management controllers. It can be understood that, the management boards 313 can further be rank management controllers, or system management controllers, or the like, the disclosure is not limited herein. Each management board 313 can monitor operations of air cooling power modules 314. Each management board 313 includes a number of terminals 3131. In some embodiments, the terminals 3131 include a number of first terminals 3132 and a second terminal 3133. Each first terminal 3132 is configured to enable a communication between the management board 313 and the other management boards 313. The second terminal 3133 is configured to enable a connection between the management board 313 and the exchanger 316. In some embodiments, the management boards 313 can include one or more master management boards 3134 and two or more slave management boards 3135. Each master management board 3134 can communicate with two or more slave management boards 3135 via the first terminals 3132. Each master management board 3134 can communicate with the corresponding slave management boards 3135 via the RS232 protocol, the RS485 protocol, or the I2C protocol, or the like. FIG. 3A illustrates that each master management board 3134 and the corresponding slave management boards 3135 are directly coupled via cables, but a person skilled in the art may understood that each master management board 3134 and the corresponding slave management boards 3135 can be coupled via an intermediate elements, the disclosure is not limited herein. Each master management board 3134 is further configured to manage the corresponding slave management boards 3135. In details, each master management board 3134 can obtain operations of air cooling power modules 314 monitored by the corresponding slave management boards, and gather the operations of air cooling power modules 314 monitored by the master management board 3134 and the obtained operations of the air cooling power modules 314 monitored by the corresponding slave management boards 3135.

Figure 3B:
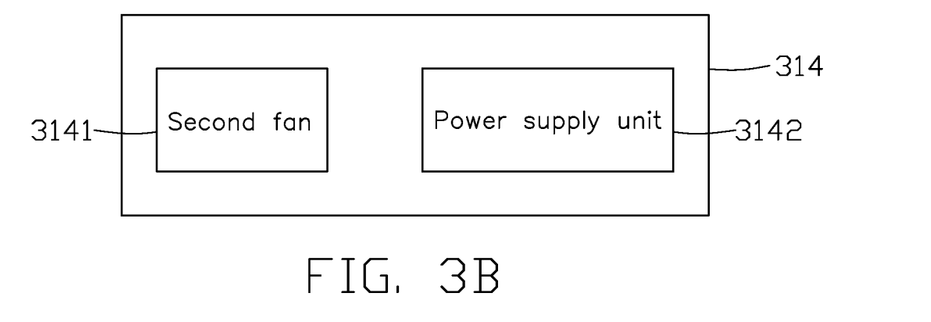
FIG. 3B is a schematic view of an embodiment of an air cooling power module in the system of FIG. 3A.

The air cooling power modules 314 can be coupled to the power distribution system 320, and are configured to convert an alternating current (AC) voltage of mains provided by the power distribution system 320 to a low voltage, and provide the low voltage to the immersion-cooled servers 311, the first fans 312, and the management boards 313. Each air cooling power module 314 can include a second fan 3141 and a power supply unit 3142, as shown in FIG. 3B. The second fans 3141 are configured to dissipate heat from the power supply units 3142 during operation of the power supply units 3142. The power supply units 3142 are configured to convert the AC voltage of the mains provided by the power distribution system 320 to a low DC voltage, and provide the low DC voltage to the immersion-cooled servers 311, the first fans 312, and the management boards 313. For example, the power supply units 3142 are configured to provide a 54 volt DC voltage to the power distribution boards 3112 of the immersion-cooled servers 311 and the first fans 312, and provide a 12 volt standby voltage to the management boards 313. The 54 volt direct current voltage is converted from a 220 volt AC voltage of the power distribution system 320. The 12 volt standby voltage is also converted from the 220 volt AC voltage of the power distribution system 320.

The demo board 315 includes a number of first interfaces 3151, a number of second interfaces 3152, a number of third interfaces 3153, and a number of fourth interfaces 3154. The first demo board 315 is coupled to the power distribution boards 3112 of the immersion-cooled servers 311 via the first interfaces 3151. The demo board 315 is coupled to the first fans 312 via the second interfaces 3152. The demo board 315 is coupled to the air cooling power modules 314 via the third interfaces 3153. The demo board 315 is further coupled to the management boards 313 via the fourth interfaces 3154. Thus, the air cooling power modules 314 can provide low voltage to the immersion-cooled servers 311, the first fans 312, and the management boards 313 via the demo board 315.

In some embodiments, the exchanger 316 is coupled to the second terminal 3133 of the master management board 3134, and is coupled to the remote management platform 330. The master management board 3134 can transmit data concerning the gathered operations of the air cooling power modules 314 to the remote management platform 330 via the exchanger 316.

Figure 4:
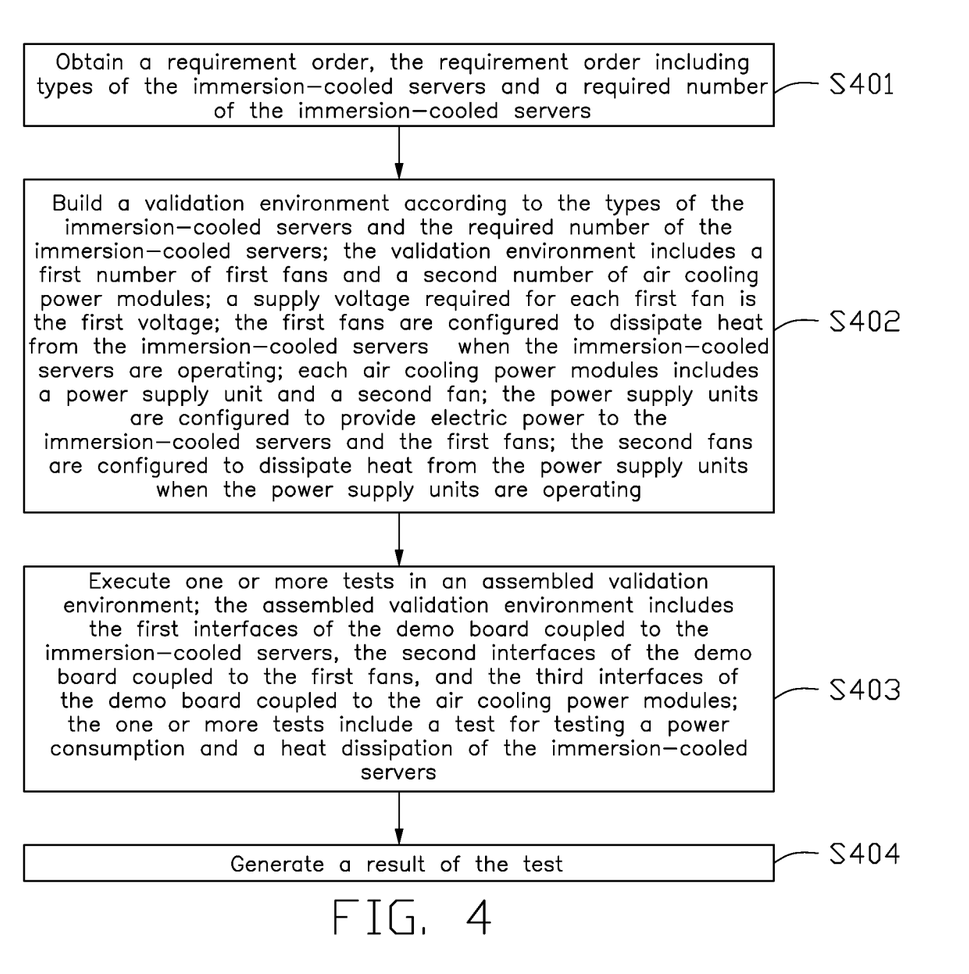
FIG. 4 is a flowchart of an embodiment of a validation method according to an embodiment of the present disclosure.

Referring to FIG. 4, FIG. 4 is a flowchart of an embodiment of a validation method. The validation method is applied on the demo board of the FIG. 3A. The validation method includes:

S401: obtaining a requirement order, the requirement order including types of the immersion-cooled servers and a required number of the immersion-cooled servers.

In some embodiments, the requirement order is a customer order. In some embodiments, the requirement order further includes a work order number and so on. The work order number is unique. The work order number is configured to uniquely indicate the requirement order. Different work order numbers can correspond to servers with different Rack Unit (U) configurations, or correspond to servers with same U configuration. For example, the work order number can correspond to a server with 1U configuration, a server with 2U configuration, a server with 3U configuration, or the like. However, different work order numbers can correspond to different types of the immersion-cooled servers and correspond to different required number of the immersion-cooled servers. For example, a work order number 1 and a work order number 2 can both correspond to servers with 1U configuration, but can correspond to different types of the immersion-cooled servers and correspond to different required number of the immersion-cooled servers. Namely, the configurations of the immersion-cooled servers of the different requirement orders are different. The Rack Unit represents a size of an outer surface of the server. The obtaining of the requirement order can be, for example obtaining the requirement order corresponding to a work order number 3. In some embodiments, the types of the immersion-cooled servers can include different kinds of the immersion-cooled servers and different models of the immersion-cooled servers. The different kinds of the immersion-cooled servers can be, for example those with hard disks, those with central processing units, with memories, and so on. The different models of the immersion-cooled servers can include, for example a first model of the hard disk, a second model of the hard disk, and so on. The requirement number of the immersion-cooled servers can include, for example a first number of the first model of the hard disks, a second number of the second model of the hard disks, a third number of the first model of the memories, and so on.

In some embodiments, each immersion-cooled server can include a server. In some embodiments, each immersion-cooled server can further include a power distribution board. Each power distribution board is configured to convert a first voltage to a second voltage, for example convert a 54 volt DC voltage to a 12 volt DC voltage. Each power distribution board is further configured to provide the second voltage to the server.

S402: building a validation environment according to the types of the immersion-cooled servers and the required number of the immersion-cooled servers; the validation environment includes a first number of first fans and a second number of air cooling power modules; a supply voltage required for each first fan is the first voltage; the first fans are configured to dissipate heat from the immersion-cooled servers when the immersion-cooled servers are operating; each air cooling power modules includes a power supply unit and a second fan; the power supply units are configured to provide electric power to the immersion-cooled servers and the first fans; the second fans are configured to dissipate heat from the power supply units when the power supply units are operating.

In some embodiments, each first fan can be a 54 volt fan.

In some embodiments, the building of a validation environment according to the types of the immersion-cooled servers and the required number of the immersion-cooled servers includes a step a1. The step a1 includes a step a11, a step a12, and a step a13. The step a11 includes determining a power consumption of all of the immersion-cooled servers when all of the immersion-cooled servers are operating at full load according to the types of the immersion-cooled servers and the required numbers of the immersion-cooled servers. The step a12 includes determining the first fans being required, the first number of the first fans, the air cooling power modules being required, and the second number of the air cooling power modules according to the power consumption of all of the immersion-cooled servers and a result of a thermal simulation on all of the immersion-cooled servers when all of the immersion-cooled servers are operating. The step a13 includes building the validation environment according to the determined first fans, the determined first number of the first fans, the determined air cooling power modules, and the determined second number of the air cooling power modules.

In some embodiments, the number of the first fans will influence an evaluation of the load of the validation system, and influence how many air cooling power modules are required. Thus, the determining of the first fans, how many first fans are required, the air cooling power modules, and how many air cooling power modules are required according to the power consumption and the result of the simulation generated by performing the thermal simulation on all of the immersion-cooled servers includes a step b1. The step b1 includes a step b11, a step b12, and a step b13. The step b11 includes performing the thermal simulation on the all of the immersion-cooled servers to determine the first fans being required and the first number of the first fans. The step b12 includes determining a power consumption of all of the first fans according to the determined first fans and the determined first number of the first fans. The step b13 includes determining the air cooling power modules being required and the second number of the air cooling power modules according to the power consumption of the all of the immersion-cooled servers and the power consumption of all of the first fans.

In some embodiments, the validation environment further includes a speed of each first fan. Thus, the determining of the first fans being required, the first number of the first fans, the air cooling power modules being required, and the second number of the air cooling power modules according to the power consumption of all of the immersion-cooled servers and the result of the thermal simulation on all of the immersion-cooled servers includes a step c1. The step c1 includes determining the first fans being required, the first number of the first fans, the speed of each first fan, the air cooling power modules being required, and the second number of the air cooling power modules according to the power consumption of all of the immersion-cooled servers and the result of the thermal simulation on the all of the immersion-cooled servers. The building of the validation environment according to the determined first fans, the determined first number of the first fans, the determined air cooling power modules, and the determined second number of the air cooling power modules includes a step d1. The step d1 includes building the validation environment according to the determined first fans, the determined first number of the first fans, the speed of each first fan, the determined air cooling power modules, and the determined second number of air cooling power modules.

In some embodiments, the speeds of the first fans can be adjusted via PWM of the first fans.

S403: executing one or more tests in an assembled validation environment; the assembled validation environment includes the first interfaces of the demo board coupled to the immersion-cooled servers, the second interfaces of the demo board coupled to the first fans, and the third interfaces of the demo board coupled to the air cooling power modules; the one or more tests include a test for testing a power consumption and a heat dissipation of the immersion-cooled servers.

In some embodiments, before the executing of the one or more tests in the assembled validation environment, the method firstly assembles the validation environment, namely, coupling the first interfaces of the demo board to the immersion-cooled servers, coupling the second interfaces of the demo board to the first fans, and coupling the third interfaces of the demo board to the air cooling power modules.

In some embodiments, the air cooling power modules can be coupled to the power distribution system. The air cooling power modules are configured to convert the AC voltage of the mains provided by the power distribution system to a first voltage, and provide the first voltage to the immersion-cooled servers and the first fans. For example, in the assembled validation environment, the air cooling power modules can provide a 54 volt DC voltage to the immersion-cooled servers and the first fans. Thus, the immersion-cooled servers can work, and the first fans can dissipate heat from the immersion-cooled servers.

In some embodiments, the test for testing the power consumption and the heat dissipation of the immersion-cooled servers can be configured to test a power consumption of the immersion-cooled servers and a heat dissipation from the immersion-cooled servers.

S404: generating a result of the test.

In some embodiments, the result of the test can include the result of the power consumption test and the result of the heat dissipation test.

In some embodiment, the method further includes a step e1 and a step e2. The step e1 includes determining whether the result of the test meets a preset condition. The step e2 includes building an updated validation environment according to the result of the test and the preset condition, and repeating executing one or more tests in the updated validation environment and generating a result of the test if the result of the test does not meet the preset condition, until the result of the test does meet the preset condition. A number of the first fans and/or a number of the air cooling power modules in the updated validation environment are varied For example, if a result 1 of the test in the assembled validation environment 1 does not meet the preset condition, the method can rebuild the validation environment 2 according to the result 1 of the test and the preset condition, and repeat the one or more tests in the assembled validation environment 2, and repeat the result 2 of the test. The result 2 of the test does meet the preset condition, thus the test is ended.

The preset condition can be set according to the power consumption of the all of the immersion-cooled servers when all of the immersion-cooled servers are operated at full load and the result of the thermal simulation on the all of the immersion-cooled servers. In some embodiments, the preset condition can include a power consumption preset condition and a heat dissipation preset condition. The power consumption preset condition can be set according to the power consumption of the all of the immersion-cooled servers when all of the immersion-cooled servers are operated at full load and the load of the all of the first fans. The heat dissipation preset condition can be set according to the result of the simulation generated by performing the thermal simulation on the all of the immersion-cooled servers.

In some embodiments, the preset condition can be a detail value or a detail range, the disclosure is not limited herein.

In some embodiments, the fourth interfaces of the demo board are coupled to the management boards. The one or more tests further include an Ethernet communication test of the management boards. The Ethernet communication test of the management boards is configured to test whether the Ethernet communication function of the management board is enabled. At the moment, the management board should be coupled to the remote management platform via the exchanger. The result of the test further include the Ethernet communication function being enabled or not enabled.

In some embodiments, the number of the fourth interfaces is at least three. The one or more tests further include a communication test between the master management board and the slave management boards. The master management board communicates with at least two slave management boards. The communication test between the master management board and the slave management boards can be configured to test whether a communication function between the master management board and the slave management boards is enabled. The result of the test further includes the communication function between the master management board and the slave management boards being enabled or not enabled.

Figure 5:
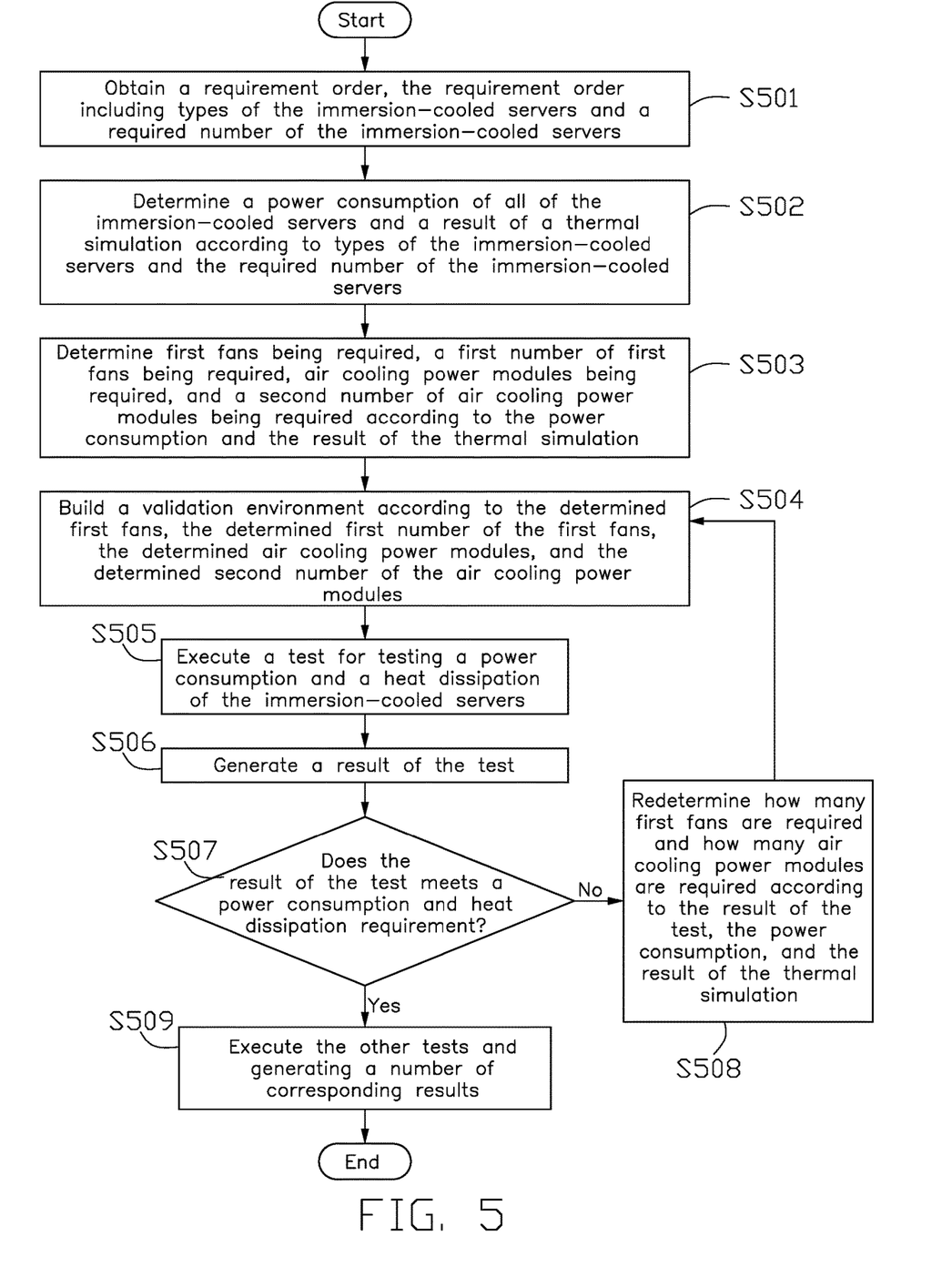
FIG. 5 is a flowchart of an embodiment of a method for validating a server in the validation method according to FIG. 4.

Referring to FIG. 5, FIG. 5 is a flowchart of an embodiment of a method for validating a server in the validation method. The method for validating the server includes:

S501: obtaining a requirement order, the requirement order including types of the immersion-cooled servers and a required number of the immersion-cooled servers.

S502: determining a power consumption of all of the immersion-cooled servers and a result of a thermal simulation according to types of the immersion-cooled servers and the required number of the immersion-cooled servers.

S503: determining first fans being required, a first number of first fans being required, air cooling power modules being required, and a second number of air cooling power modules being required according to the power consumption and the result of the thermal simulation.

S504: building a validation environment according to the determined first fans, the determined first number of the first fans, the determined air cooling power modules, and the determined second number of the air cooling power modules.

S505: executing a test for testing a power consumption and a heat dissipation of the immersion-cooled servers.

S506: generating a result of the test.

S507: determining whether the result of the test meets a power consumption and heat dissipation requirement. If the result of the test does not meet the power consumption and heat dissipation requirement, the procedure goes to S508. If the result of the test meets the power consumption and heat dissipation requirement, the procedure goes to S509.

S508: redetermining how many first fans are required and how many air cooling power modules are required according to the result of the test, the power consumption, and the result of the thermal simulation. Then the procedure goes to S504.

S509: executing the other tests and generating a number of corresponding results.

In some embodiments, the assembling of the validation environment can include an operator coupling the immersion-cooled servers, the determined first fans, and the determined air cooling power modules to the demo board. It can be understood that the assembling of the validation environment can further include coupling the air cooling power modules to the power distribution system, the disclosure is not limited herein.

It can be understood that the step S509 can be executed before the step S505, the disclosure is not limited herein.

It can be understood that the step S509 can be omitted, the disclosure is not limited herein.

Figure 6:
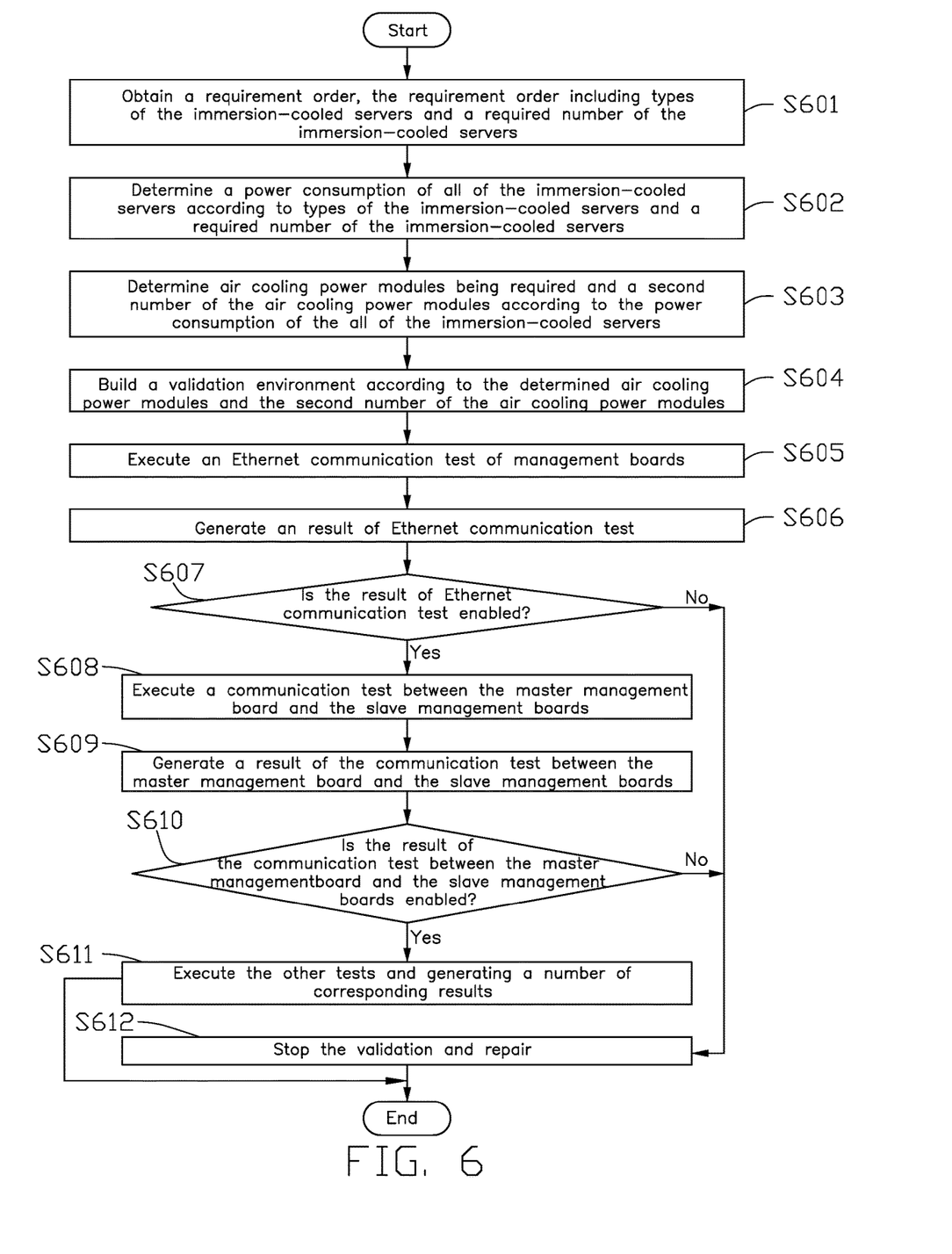
FIG. 6 is a flowchart of an embodiment of a method for validating a management board in the validation method according to FIG. 4.

Referring to FIG. 6, FIG. 6 is a flowchart of an embodiment of a method for validating a management board in the validation method. The method for validating the management board includes:

S601: obtaining a requirement order, the requirement order including types of the immersion-cooled servers and a required number of the immersion-cooled servers.

S602: determining a power consumption of all of the immersion-cooled servers according to types of the immersion-cooled servers and a required number of the immersion-cooled servers.

S603: determining air cooling power modules being required and a second number of the air cooling power modules according to the power consumption of the all of the immersion-cooled servers.

S604: building a validation environment according to the determined air cooling power modules and the second number of the air cooling power modules.

S605: executing an Ethernet communication test of management boards.

S606: generating an result of Ethernet communication test.

S607: determining whether the result of Ethernet communication test is enabled. If the result of the Ethernet communication test is enabled, the procedure goes to S608. If the result of the Ethernet communication test is not enabled, the procedure goes to S612.

S608: executing a communication test between the master management board and the slave management boards.

S609: generating a result of the communication test between the master management board and the slave management boards.

S610: determining whether the result of the communication test between the master management board and the slave management boards is enabled. If the result of the communication test between the master management board and the slave management boards is enabled, the procedure goes to S611. If the result of the communication test between the master management board and the slave management boards is not enabled, the procedure goes to S612.

S611: executing the other tests and generating a number of corresponding results.

S612: stopping the validation and repairing.

In some embodiments, the assembling of the validation environment can include an operator coupling the determined air cooling power modules and the management boards to the demo board. It can be understood that, the assembling of the validation environment can further include coupling the air cooling power modules to the power distribution system, and coupling the management boards to a remote management platform via the exchanger, the disclosure is not limited herein.

In some embodiments, in a process of assembling validation environment in the step S604 of the FIG. 6, the immersion-cooled servers are not assembled. It can be understood that, the step S602 can further include determining result of thermal simulation according to the types of the immersion-cooled servers and the required number of the immersion-cooled servers, the step S603 can include accordingly determining first fans being required, a first number of the first fans, air cooling power modules being required, and the second number of the air cooling power modules according to the power consumption and the result of the thermal simulation, and the step S604 can include building a validation environment according to the determined first fans, the determined first number of the first fans, the determined air cooling power modules, and the determined second number of the air cooling power modules, the immersion-cooled servers need to be assembled in the assembled validation environment, the disclosure is not limited herein.

It can be understood that, the steps S608-S610 can be exchanged for the steps S605-S607; the step S611 can be executed before the step S605, or before the step S608, the disclosure is not limited herein.

It can be understood that, the step S611 can be omitted, the disclosure is not limited herein.

Figure 7:
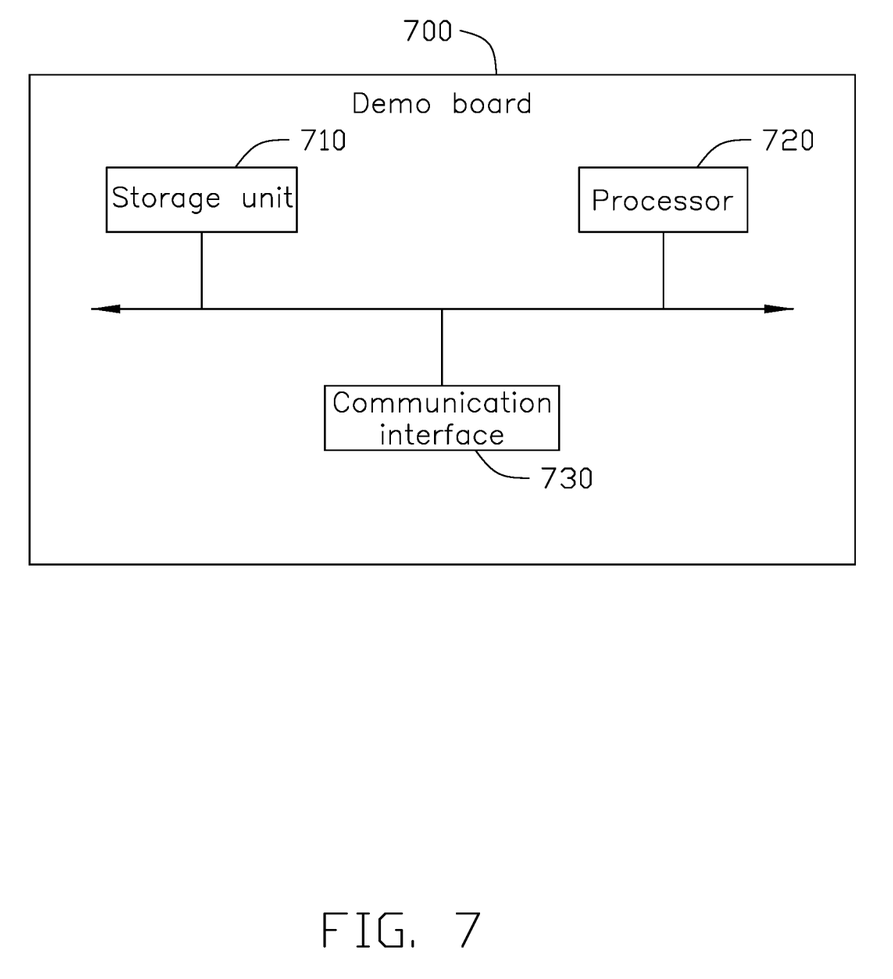
FIG. 7 is a schematic view of an embodiment of a demo board in the system of FIG. 3A.

Referring to FIG. 7, FIG. 7 is a schematic view of an embodiment of a demo board. The demo board 700 can include a storage unit 710, a processor 720, and a communication interface 730. A person skilled in the art may understand that the structure shown in FIG. 7 imposes no limitation on the demo board 700, and the demo board 700 may include more or fewer components than those shown in the figure, or may combine or divide some components, or have different component arrangements.

The storage unit 710 may be configured to store a software program and module/unit. The processor 720 runs the software program and modules/units stored in the storage unit 710, and invokes the data stored in the storage unit 710, to implement various functions of the demo board 700. The storage unit 710 may include a program storage area and a data storage area. The program storage area may store an application program, and the like. The data storage area may store data (such as various results of test) created according to use of the demo board 700, and the like. In addition, the storage unit 710 may include a non-transitory storage medium, such as hard disk, memory, or the like. It can be understood that the storage unit 710 may further include a non-transitory storage medium, such as a pluggable hard disk, a smart media card, a secure digital card, a flash card, at least one magnetic disk storage device, a flash storage unit, or another volatile solid-state storage device.

The processor 720 can include one or more central processing units, and further include general-purpose processors, digital signal processors, application specific integrated circuits, field-programmable gate arrays, or other programmable logic devices, discrete gate or transistor logic, discrete hardware components, and so on. The processor 720 can be a microprocessor or the processor 720 can be any conventional processor. The processor 720 is the control center of the demo board 700, and is connected to various parts of the demo board 700 by using various interfaces and lines.

The communication interface 730 can include a number of first interfaces, a number of second interfaces, a number of third interfaces, a number of fourth interfaces, and the like. The communication interface 730 is configured to enable a communication between the demo board 700 and the immersion-cooled servers, the first fans, the air cooling power modules, and the management boards.

In some embodiments, the embodiment of the present disclosure further provides a computer storage medium where computer executable instructions are stored herein, the computer executable instructions are used for executing the validation method in the FIG. 4.

The disclosure obtains the requirement order, builds the validation environment including the first number of the first fans and the second number of the air cooling power modules, executes the one or more tests in the assembled validation environment, and generates the result of the test. The first fans are configured to dissipate heat from the immersion-cooled servers when the immersion-cooled servers are operating. Each air cooling power module includes a power supply unit and a second fan. The power supply units are configured to provide power for the immersion-cooled servers and the first fans. The second fans are configured to dissipate heat from the power supply units when the power supply units are operating. Thus, the disclosure can validate the immersion-cooled servers in the air cooling environment and lower the validation cost, and the disclosure builds the validation environment according to the requirement order, thus the validation requirement of the immersion-cooled servers with different configurations can be met, and the number of air cooling power modules and first fans can be flexibly increased or decreased according to the immersion-cooled servers with different configurations, thus a quick validation on the immersion-cooled servers can be achieved.

In the several embodiments provided in the present application, it should be understood that the disclosed device and method may be implemented in other manners. For example, the described device embodiment is merely exemplary. For example, the module division or the unit division is merely a logical function division and there may be other bases of division in actual implementation. For example, multiple units or components may be combined or integrated into another device, or some features may be ignored or not performed.

In addition, functional units in the embodiments of the present invention may be integrated into one processing unit, or each of the units may exist alone physically, or two or more units are integrated into one unit.

Based on the description of the foregoing implementation manners, a person skilled in the art may clearly understand that the present disclosure may be implemented by software in addition to necessary universal hardware, or by dedicated hardware, including a dedicated integrated circuit, a dedicated CPU, a dedicated memory, a dedicated component, and the like. Generally, any functions that can be performed by a computer program can be implemented using corresponding hardware. Moreover, a specific hardware structure used to achieve a same function may be of various forms, for example, in a form of an analog circuit, a digital circuit, a dedicated circuit, or the like. However, for the present disclosure, implementation by software program is done in most cases. Based on such an understanding, the technical solutions of the present disclosure essentially or the part contributing to the prior art may be implemented in a form of a software product. The software product is stored in a readable storage medium, such as a floppy disk, a universal serial bus (USB) flash drive, a removable hard disk, a read-only memory (ROM), a random access memory (RAM), a magnetic disk, or an optical disc of a computer, and includes several instructions for instructing a computer device (which may be a personal computer, a server, a network device, and the like) to perform the methods described in the embodiments of the present disclosure.

All or some of the foregoing embodiments may be implemented by means of software, hardware, firmware, or any combination thereof. When software is used to implement the embodiments, the embodiments may be implemented completely or partially in a form of a computer program product.

The computer program product includes one or more computer instructions. When the computer program instructions are loaded and executed on the computer, the procedure or functions according to the embodiments of the present disclosure are all or partially generated. The computer may be a general-purpose computer, a special-purpose computer, a computer network, or other programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired manner (for example, a coaxial cable, an optical fiber, or a digital subscriber line (DSL)) or a wireless manner (for example, infrared, radio, or microwave). The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive Solid State Disk (SSD)), or the like.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. A validation method configured to validate immersion-cooled servers in an air cooling environment, a supply voltage required for each of the immersion-cooled servers being a first voltage, the method being applied on a demo board, the method comprising:
    obtaining a requirement order, the requirement order comprising types of immersion-cooled servers and a required number of the immersion-cooled servers;
    building a validation environment according to the types of the immersion-cooled servers and the required number of the immersion-cooled servers; the validation environment comprising a first number of first fans and a second number of air cooling power modules; a supply voltage required for each of the first fans being the first voltage; the first fans being configured to dissipate heat from the immersion-cooled servers when the immersion-cooled servers are operating; each of the air cooling power modules comprising a power supply unit and a second fan; the power supply units being configured to provide electric power to the immersion-cooled servers and the first fans; the second fans being configured to dissipate heat from the power supply units when the power supply units are operating;
    executing one or more tests in an assembled validation environment; the assembled validation environment comprising a plurality of first interfaces of the demo board coupled to the immersion-cooled servers, a plurality of second interfaces of the demo board coupled to the first fans, and a plurality of third interfaces of the demo board coupled to the air cooling power modules; the one or more tests comprising a test for testing a power consumption and a heat dissipation of the immersion-cooled servers; and
    generating a result of test.

2. The method according to claim 1, further comprising:
    determining whether the result of the test meets a preset condition; and
    building an updated validation environment according to the result of the test and the preset condition, and repeating executing one or more tests in the updated validation environment and generating a result of the test if the result of the test does not meet the preset condition, until the result of the test meets the preset condition; wherein a number of the first fans and/or a number of the air cooling power modules in the updated validation environment are varied.

3. The method according to claim 1, wherein building the validation environment according to the types of the immersion-cooled servers and the required number of the immersion-cooled servers comprises:
    determining a power consumption of all of the immersion-cooled servers when all of the immersion-cooled servers are operating at full load according to the types of the immersion-cooled servers and the required numbers of the immersion-cooled servers; and
    determining the first fans being required, the first number of the first fans, the air cooling power module being required, and the second number of the air cooling power modules according to the power consumption of all of the immersion-cooled servers and a result of a thermal simulation on all of the immersion-cooled servers when all of the immersion-cooled servers are operating;
    building the validation environment according to the determined first fans, the determined first number of the first fans, the determined air cooling power modules, and the determined second number of the air cooling power modules.

4. The method according to claim 3, wherein determining the first fans being required, the first number of the first fans, the air cooling power modules being required, and the second number of the air cooling power modules according to the power consumption of all of the immersion-cooled servers and the result of the thermal simulation on all of the immersion-cooled servers comprises:
    performing the thermal simulation on the all of the immersion-cooled servers to determine the first fans being required and the first number of the first fans;
    determining a power consumption of all of the first fans according to the determined first fans and the determined first number of the first fans; and
    determining the air cooling power modules being required and the second number of the air cooling power modules according to the power consumption of all of the immersion-cooled servers and the power consumption of the all of the first fans.

5. The method according to claim 1, wherein:
in the assembled validation environment, a 54 volt direct current voltage is provided to the immersion-cooled servers and the first fans via the air cooling power modules.

6. The method according to claim 1, wherein:
in the assembled validation environment, a number of fourth interfaces of the demo board are coupled to a plurality of management boards; and
the one or more tests further comprise an Ethernet communication test of the plurality of management boards.

7. The method according to claim 6, wherein:
the number of the fourth interfaces is at least three; the plurality of management boards comprises one or more master management boards and two or more slave management boards; each of the master management boards is configured to manage the corresponding two or more slave management boards; and
the one or more tests further comprise a communication test between each of the master management boards and the corresponding two or more slave management boards.

8. A demo board comprising:
a storage device;
at least one processor; and
the storage device storing one or more programs, which when executed by the at least one processor, cause the at least one processor to:
obtain a requirement order, the requirement order comprising types of immersion-cooled servers and a required number of the immersion-cooled servers; a supply voltage required for each of the immersion-cooled servers being a first voltage;
build a validation environment according to the types of the immersion-cooled servers and the required number of the immersion-cooled servers; the validation environment comprising a first number of first fans and a second number of air cooling power modules; a supply voltage required for each of the first fans being the first voltage; the first fans being configured to dissipate heat from the immersion-cooled servers when the immersion-cooled servers are operating; each of the air cooling power modules comprising a power supply unit and a second fan; the power supply units being configured to provide electric power to the immersion-cooled servers and the first fans; the second fans being configured to dissipate heat from the power supply units when the power supply units are operating;
execute one or more tests in an assembled validation environment; the assembled validation environment comprising a plurality of first interfaces of the demo board coupled to the immersion-cooled servers, a plurality of second interfaces of the demo board coupled to the first fans, and a plurality of third interfaces of the demo board coupled to the air cooling power modules; the one or more tests comprising a test for testing a power consumption and a heat dissipation of the immersion-cooled servers; and
generate a result of the test.

9. The demo board according to claim 8, further causing the at least one processor to:
determine whether the result of the test meets a preset condition; and
build an updated validation environment according to the result of the test and the preset condition, and repeating executing one or more tests in the updated validation environment and generating a result of the test if the result of the test does not meet the preset condition, until the result of the test meets the preset condition; wherein a number of the first fans and/or a number of the air cooling power modules in the updated validation environment are varied.

10. The demo board according to claim 8, further causing the at least one processor to:
determine a power consumption of all of the immersion-cooled servers when all of the immersion-cooled servers are operating at full load according to the types of the immersion-cooled servers and the required numbers of the immersion-cooled servers;
determine the first fans being required, the first number of first fans, the air cooling power modules being required, and the second number of the air cooling power modules according to the power consumption of all of the immersion-cooled servers and a result of a thermal simulation on all of the immersion-cooled servers when all of the immersion-cooled servers are operating;
build the validation environment according to the determined first fans, the determined first number of the first fans, the determined air cooling power modules, and the determined second number of the air cooling power modules.

11. The demo board according to claim 10, further causing the at least one processor to:
perform the thermal simulation on the all of the immersion-cooled servers to determine the first fans being required and the first number of the first fans;
determine a power consumption of all of the first fans according to the determined first fans and the determined first number of the first fans;
determine the air cooling power modules being required and the second number of the air cooling power modules according to the power consumption of all of the immersion-cooled servers and the power consumption of the all of the first fans.

12. The demo board according to claim 8, wherein:
in the assembled validation environment, a 54 volt direct current voltage is provided to the immersion-cooled servers and the first fans via the air cooling power modules.

13. The demo board according to claim 8, wherein:
in the assembled validation environment, a number of fourth interfaces of the demo board are coupled to a plurality of management boards; and the one or more tests further comprises an Ethernet communication test of the plurality of management boards.

14. The demo board according to claim 13, wherein:
the number of the fourth interfaces is at least three; the plurality of management boards comprises one or more master management boards and two or more slave management boards; each of the master management boards is configured to manage the corresponding two or more slave management boards; and the one or more tests further comprise a communication test between each of the master management boards and the corresponding two or more slave management boards.

15. A non-transitory storage medium storing a set of commands, when the commands being executed by at least one processor of a demo board, causing the at least one processor to:
obtain a requirement order, the requirement order comprising types of immersion-cooled servers and a required number of the immersion-cooled servers; a supply voltage required for each of the immersion-cooled servers being a first voltage;

build a validation environment according to the types of the immersion-cooled servers and the required number of the immersion-cooled servers; the validation environment comprising a first number of first fans and a second number of air cooling power modules; a supply voltage required for each of the first fans being a first voltage; the first fans being configured to dissipate heat from the immersion-cooled servers when the immersion-cooled servers are operating; each of the air cooling power modules comprising a power supply unit and a second fan; the power supply units being configured to provide electric power to the immersion-cooled servers and the first fans; the second fans being configured to dissipate heat from the power supply units when the power supply units are operating;

execute one or more tests in an assembled validation environment; the assembled validation environment comprising a plurality of first interfaces of the demo board coupled to the immersion-cooled servers, a plurality of second interfaces of the demo board coupled to the first fans, and a plurality of third interfaces of the demo board coupled to the air cooling power modules; the one or more tests comprising a test for testing a power consumption and a heat dissipation of the immersion-cooled servers; and generate a result of test.

16. The non-transitory storage medium according to claim 15, further causing the at least one processor to:
determine whether the result of the test meets a preset condition; and
build an updated validation environment according to the result of the test and the preset condition, and repeating executing one or more tests in the updated validation environment and generating a result of the test if the result of the test does not meet the preset condition, until the result of the test meets the preset condition; wherein a number of the first fans and/or a number of the air cooling power modules in the updated validation environment are varied.

17. The non-transitory storage medium according to claim 15, further causing the at least one processor to:
determine a power consumption of all of the immersion-cooled servers when all of the immersion-cooled servers are operating at full load according to the types of the immersion-cooled servers and the required numbers of the immersion-cooled servers; and
determine the first fans being required, the first number of the first fans, the air cooling power modules being required, and the second number of the air cooling power modules according to the power consumption of all of the immersion-cooled servers and a result of a thermal simulation on all of the immersion-cooled servers when all of the immersion-cooled servers are operating;
build the validation environment according to the determined first fans, the determined first number of the first fans, the determined air cooling power modules, and the determined second number of the air cooling power modules.

18. The non-transitory storage medium according to claim 17, further causing the at least one processor to:
perform the thermal simulation on the all of the immersion-cooled servers to determine the first fans being required and the first number of the first fans;
determine a power consumption of all of the first fans according to the determined first fans and the determined first number of the first fans;
determine the air cooling power modules being required and the second number of the air cooling power modules according to the power consumption of all of the servers and the power consumption of the all of the first fans.

19. The non-transitory storage medium according to claim 15, wherein:
in the assembled validation environment, a 54 volt direct current voltage is provided to the immersion-cooled servers and the first fans via the air cooling power modules.

20. The non-transitory storage medium according to claim 15, wherein:
in the assembled validation environment, a number of fourth interfaces of the demo board are coupled to a plurality of management boards; and the one or more tests further comprise an Ethernet communication test of the plurality of management boards.

* * * * *